US010012688B2

(12) United States Patent
Ohtsuka et al.

(10) Patent No.: US 10,012,688 B2
(45) Date of Patent: Jul. 3, 2018

(54) DISCHARGE OCCURRENCE STATUS EVALUATION DEVICE AND EVALUATION METHOD

(71) Applicant: KYUSHU INSTITUTE OF TECHNOLOGY, Fukuoka (JP)

(72) Inventors: Shinya Ohtsuka, Fukuoka (JP); Kotaro Tsuboi, Fukuoka (JP); Sho Iwai, Fukuoka (JP)

(73) Assignee: KYUSHU INSTITUTE OF TECHNOLOGY, Fukuoka (JP)

( * ) Notice: Subject to any disclaimer, the term of this patent is extended or adjusted under 35 U.S.C. 154(b) by 273 days.

(21) Appl. No.: 14/786,315

(22) PCT Filed: Dec. 5, 2013

(86) PCT No.: PCT/JP2013/082668
§ 371 (c)(1),
(2) Date: Oct. 22, 2015

(87) PCT Pub. No.: WO2014/174719
PCT Pub. Date: Oct. 30, 2014

(65) Prior Publication Data
US 2016/0169958 A1    Jun. 16, 2016

(30) Foreign Application Priority Data
Apr. 23, 2013   (JP) .................. 2013-090307

(51) Int. Cl.
*G01R 31/12*   (2006.01)
*G01R 31/00*   (2006.01)
*G01R 31/08*   (2006.01)

(52) U.S. Cl.
CPC ....... *G01R 31/1218* (2013.01); *G01R 31/001* (2013.01); *G01R 31/08* (2013.01); *G01R 31/1263* (2013.01)

(58) Field of Classification Search
CPC .................................................. G01R 31/1218
See application file for complete search history.

(56) References Cited

U.S. PATENT DOCUMENTS

| | | | |
|---|---|---|---|
| 2007/0164747 A1* | 7/2007 | Maloney | G01R 31/001 324/382 |
| 2010/0013494 A1* | 1/2010 | Twerdochlib | G01R 31/346 324/536 |
| 2011/0238345 A1* | 9/2011 | Gauthier | G01R 31/002 702/64 |

OTHER PUBLICATIONS

HP of Noise Laboratory Co., Ltd., http://www.noiseken.co.jp/modules/ products/index.php?content_id=189.

(Continued)

*Primary Examiner* — Jermele M Hollington
*Assistant Examiner* — Feba Pothen
(74) *Attorney, Agent, or Firm* — McGlew and Tuttle, P.C.

(57) ABSTRACT

The present invention evaluates the status of discharge or dielectric breakdown having occurred as a result of application of an impulse voltage or current to a test sample by an electrostatic discharge tester. An electromagnetic wave antenna measures a radiation electromagnetic wave signal generated from the electrostatic discharge tester when the electrostatic discharge tester is driven and a radiation electromagnetic wave signal generated from the test sample when discharge or dielectric breakdown occurs. An evaluation section main body obtains and displays a dielectric breakdown occurrence timing TFO after application of the voltage and a dielectric breakdown voltage VFO. The dielectric breakdown occurrence timing TFO is obtained from the time difference between an applied voltage generation time obtained from the radiation electromagnetic wave signal generated when the electrostatic discharge tester was driven and a discharge generation time obtained from (Continued)

the radiation electromagnetic wave signal generated when dielectric breakdown occurred.

9 Claims, 11 Drawing Sheets

(56) References Cited

OTHER PUBLICATIONS

Masanori Hara, "Discussion on Gaseous Discharge", p. 127 (2011).
Kotaro Tsuboi, Sho Iwai, Shinya Otsuka, "Fundamental Study of Flashover Phenomenon between Foil Conductors on Printed Wiring Board on ESD Test with an ESD gun", Technical report of the Institute of Electronics, Information, and Communication Engineers, pp. 61-65, Dec. 14, 2012.
Sho Iwai, Kotaro Tsuboi, Shinya Ohtsuka (Kyushu Institute of Technology), "Generation Timing of Flashover Phenomenon of the Foil Conductor Gap Formed on the Printed Wiring Board by ESD gun", 2013 IEE Japan, p. 82, Mar. 20, 2013.
Sho Iwai, Kotaro Tsuboi, Jun Inami, Katsuji Hirabayashi, Shinya Ohtsuka (Kyushu Institute of Technology), "Gap length Dependence of Flashover Voltage between Foil Conductors on Printed Wiring Board against ESD Surge", 2012 IEICE Japan Technical Report, pp. 41-44, Jun. 2012.

* cited by examiner

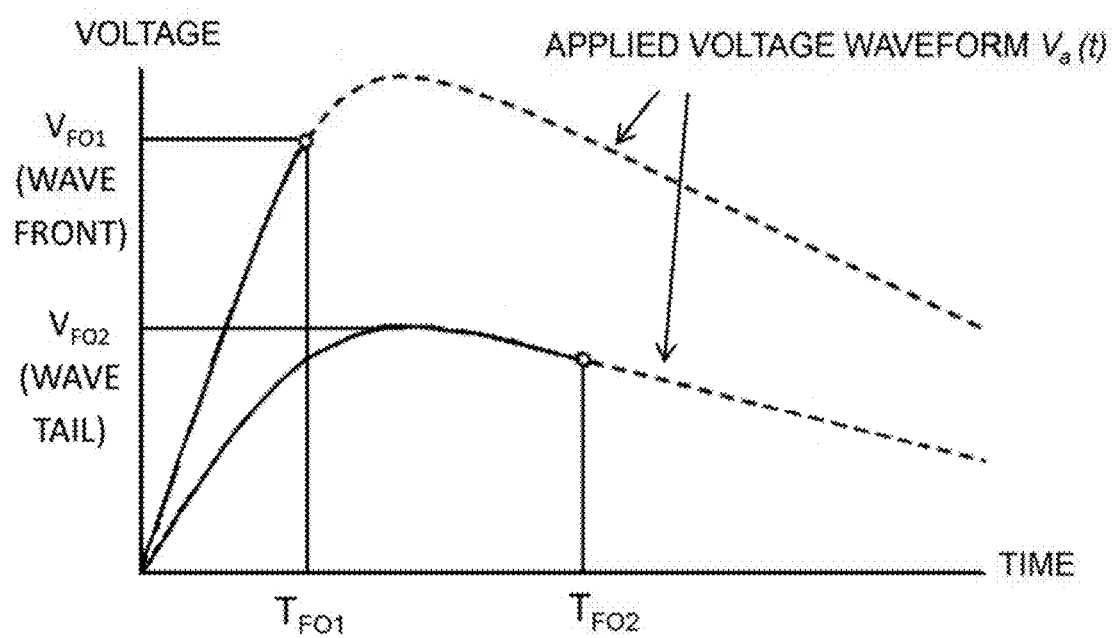

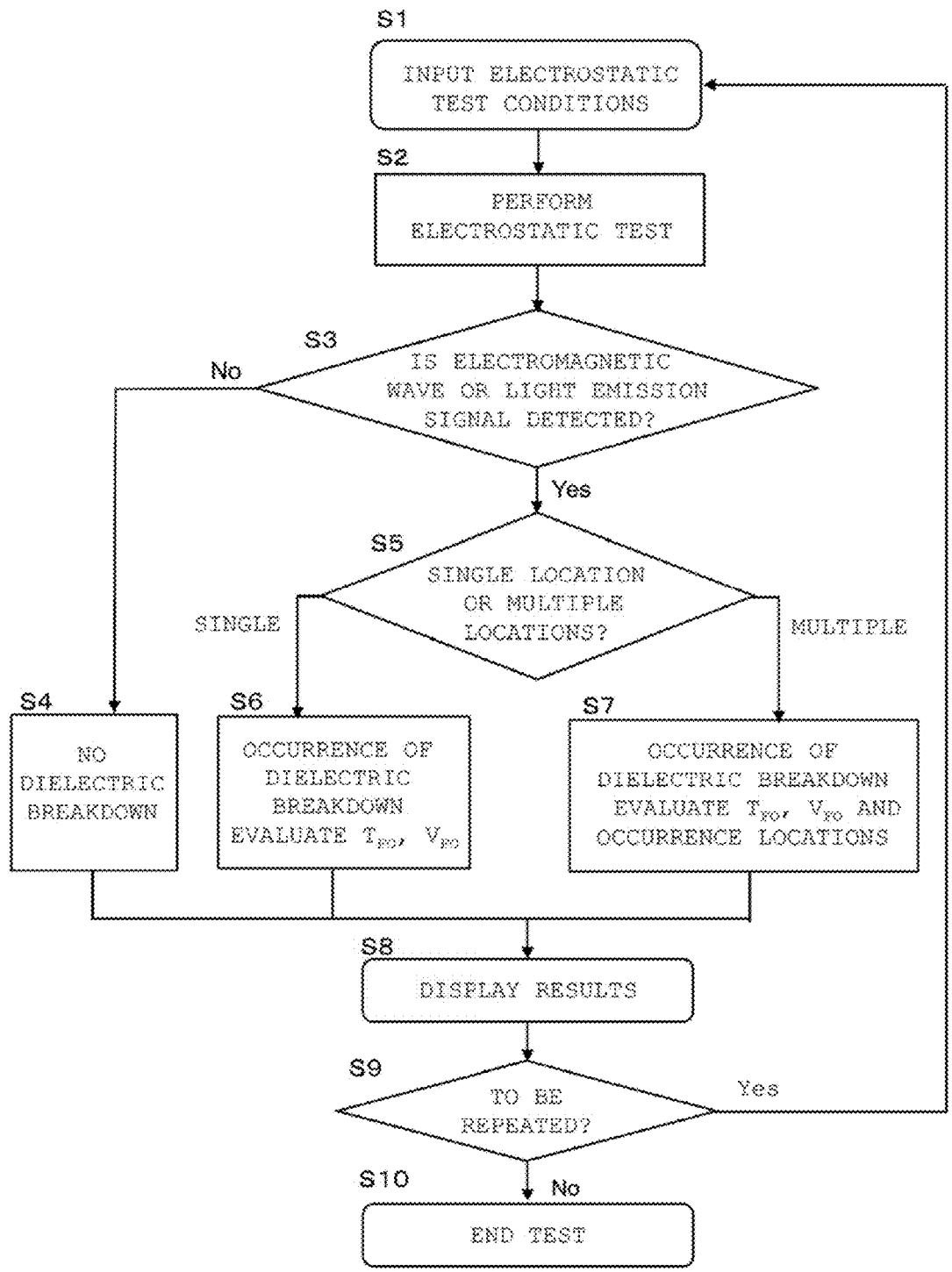

$L_1 \neq L_2 \neq L_3 \neq \cdots \neq L_N$

FIG. 6(A)
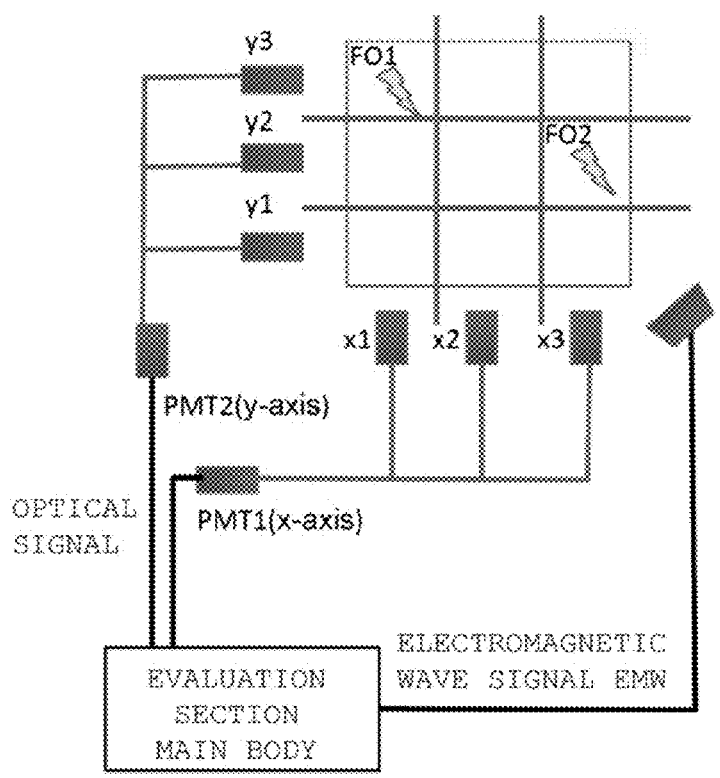
FIG. 6(B)
EXAMPLE OF ADDRESSES OF DIVISIONAL REGIONS
| P1 | P2 | P3 |
|----|----|----|
| P4 | P5 | P6 |
| P7 | P8 | P9 |
FIG. 6(C)
FIG. 6(D)
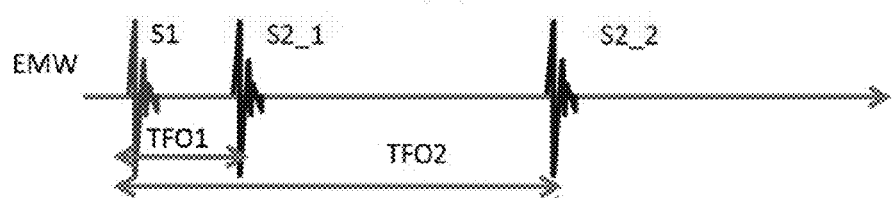
FIG. 6(E)
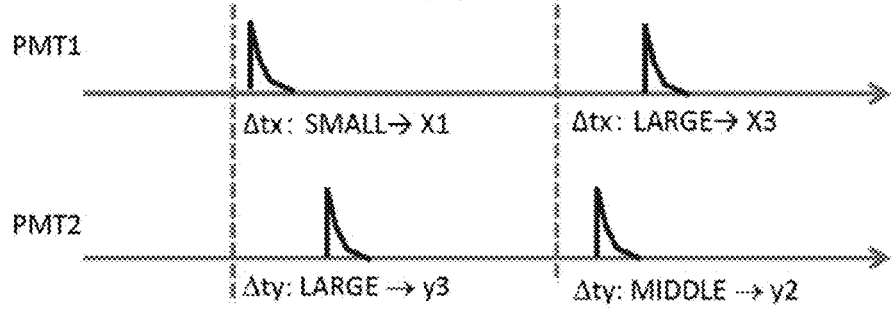

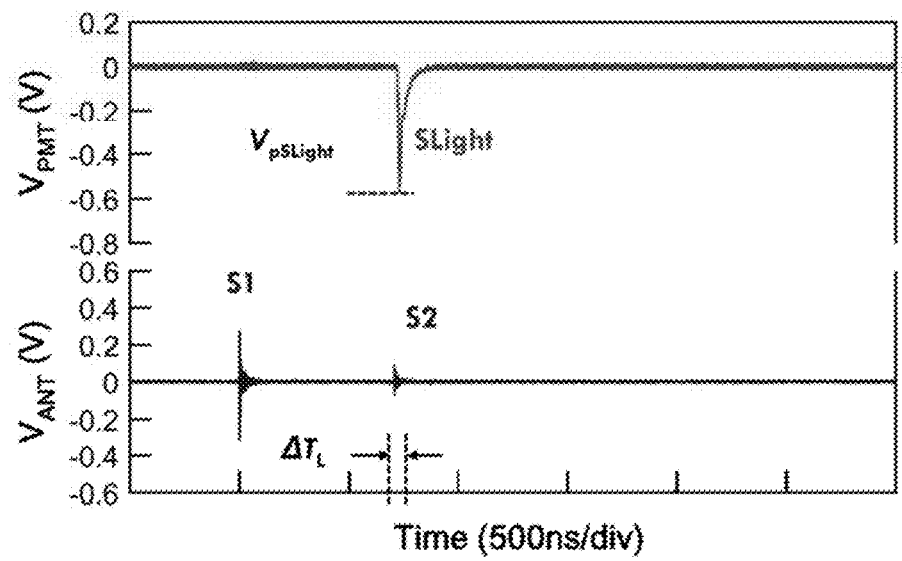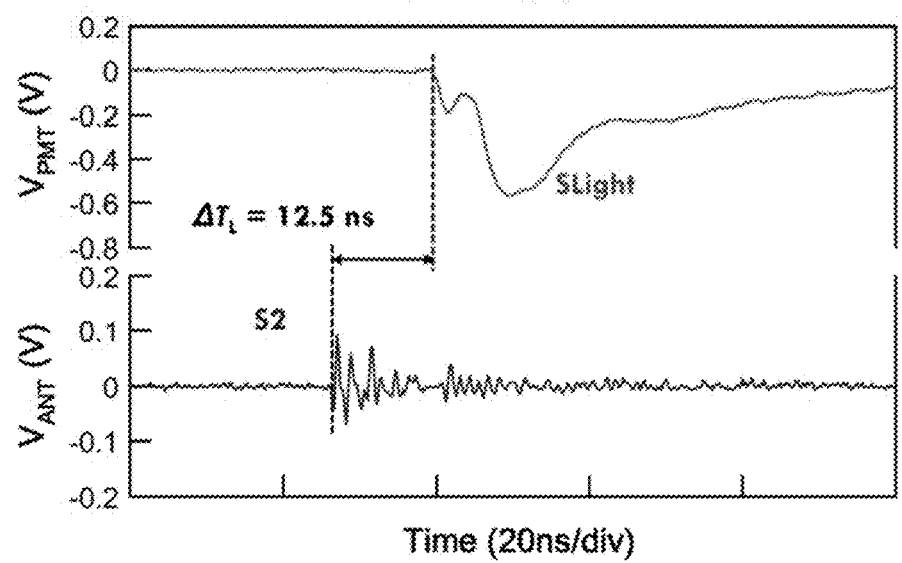

DISCHARGE OCCURRENCE STATUS EVALUATION DEVICE AND EVALUATION METHOD

This application claims the benefit of PCT International Application Number PCT/JP2013/082668 filed Dec. 5, 2013 and Japanese Application No. 2013-090307 filed, Apr. 23, 2013 in Japan, the disclosures of which are incorporated herein by reference.

TECHNICAL FIELD

The present invention relates to a discharge occurrence status evaluation device and an evaluation method for evaluating the status of discharge or dielectric breakdown having occurred as a result of application of an impulse voltage or current to a test sample by an electrostatic discharge tester.

BACKGROUND ART

Recent electrostatic discharge test apparatuses have a function of reporting occurrence of gaseous discharge. For example, Non-Patent Document 1 includes a description regarding an electrostatic tester having a "discharge detection function" of checking whether or not gaseous discharge has occurred. However, mere use of this discharge detection function does not allow us to know the timing at which discharge occurred and the instantaneous voltage at the time of occurrence of discharge. Therefore, information sufficient to consider a technique for suppressing discharge has not been obtained.

Meanwhile, electrostatic discharge ESD has a short rising time of 1 ns or less and a high voltage of about several hundreds of volts to 30 kV. Since a probe, such as a potential divider, which allows an oscilloscope to measure such a steep high voltage waveform is not available on the market, there is a problem in that electrostatic discharge cannot be measured at present.

PRIOR ART DOCUMENTS

Non-Patent Documents

Non-Patent Document 1: HP of Noise Laboratory Co., Ltd. http://www.noiseken.co.jp/modules/products/index.php?content_id=189

Non-Patent Document 2: Masanori Hara, "Discussion on Gaseous Discharge", p. 127 (2011)

Non-Patent Document 3: Kotaro Tsuboi, Sho Iwai, Shinya Otsuka, "Fundamental Study of Flashover Phenomenon between Foil Conductors on Printed Wiring Board on ESD Test with an ESD gun", Technical report of the Institute of Electronics, Information, and Communication Engineers, pp 61-65, Dec. 14, 2012.

SUMMARY OF THE INVENTION

Problem to be Solved by the Invention

The voltage waveform of electrostatic discharge ESD output from an electrostatic discharge tester is known to have a rising time of 1 ns or less and be very steep. Since a probe, such as a potential divider, for measuring such a steep voltage waveform of several tens of kilovolts is not available on the market, the waveform cannot be observed at the present. Therefore, it has been impossible to know the timing on the waveform of the electrostatic discharge ESD at which discharge or dielectric breakdown occurred.

In view of the foregoing, an object of the present invention is to find the dielectric breakdown voltage and timing at which discharge occurred on a test sample such as a circuit board in a test performed through use of an electrostatic discharge (ESD) test apparatus. Thus, it becomes possible to know the timing at which an electrical anomalous phenomenon such as discharge occurred on a test sample as a result of application of steep voltage such as electrostatic discharge ESD.

The present inventors presented a paper entitled "Basic investigation on the phenomenon of occurrence of breakdown across the gap between patterns on a printed wiring board at the time of an electrostatic discharge test performed with an ESD gun" (see Non-Patent Document 3). This basic investigation is described in the present specification with reference to FIGS. 8 to 11. The present invention is based on the results of a measurement test in which a printed wiring board was used as a test sample and there was observed (measured) the phenomenon of dielectric breakdown that occurred across the gap between patterns on the printed wring board as a result of application of electrostatic discharge (ESD) surge voltage through use of an ESD gun.

Means for Solving the Problem

A discharge occurrence status evaluation device and an evaluation method of the present invention evaluate the status of discharge or dielectric breakdown having occurred as a result of application of an impulse voltage or current to a test sample by an electrostatic discharge tester. An electromagnetic wave antenna measures a radiation electromagnetic wave signal generated from the electrostatic discharge tester when the electrostatic discharge tester is driven and a radiation electromagnetic wave signal generated from the test sample when discharge or dielectric breakdown occurs. An evaluation section main body obtains and displays a dielectric breakdown occurrence timing TFO after application of the voltage and a dielectric breakdown voltage VFO estimated on the basis of the timing. The dielectric breakdown occurrence timing TFO is obtained from a time difference between an applied voltage generation time obtained from the radiation electromagnetic wave signal generated when the electrostatic discharge tester was driven and a discharge generation time obtained from the radiation electromagnetic wave signal generated when the discharge or dielectric breakdown occurred.

Further, an optical sensor is provided so as to obtain a light emission signal generated when the discharge or dielectric breakdown occurred. Also, at least two optical sensor systems each composed of the optical sensor and a plurality of optical fibers attached to the optical sensor and having different lengths are disposed along different directions. A plurality of locations where discharge or dielectric breakdown occurred and timings at which discharge or dielectric breakdown occurred are determined on the basis of the layout of each optical sensor system in which light emission signal detecting ends of the optical fibers face divisional regions of the measurement target, differences in length among the plurality of optical fibers, and the radiation electromagnetic wave signal.

Test conditions input to the electrostatic discharge tester and electrical circuit conditions of a test circuit are sent to the evaluation section main body, and simulation for estimating the waveform of the impulse voltage applied to the test sample is performed. When dielectric breakdown occurs at a wave front of the waveform of the impulse voltage before its peak, an instantaneous value of the impulse voltage is obtained as the dielectric breakdown voltage VFO. When dielectric breakdown occurs at a wave tail of the waveform of the impulse voltage after its peak, a peak value of the impulse voltage is obtained as the dielectric breakdown voltage VFO. The evaluation section main body displays the dielectric breakdown occurrence timing TFO and the dielectric breakdown voltage VFO by superimposing them on the estimated impulse voltage waveform. An image cameral for capturing a light emission image on the test sample is provided, and the evaluation section main body can display the obtained light emission image.

Effects of the Invention

According to the present invention, it is possible to know the timing (occurrence time after voltage application) at which dielectric breakdown occurred and the dielectric breakdown voltage in an electrostatic test performed through use of an electrostatic discharge tester. As a result, it becomes possible to know not only the presence/absence of occurrence of dielectric breakdown, which has been conventionally estimated, but also the state of occurrence of discharge and the breakdown voltage. As a result, when the waveform of the applied voltage is known, the discharge voltage can be defined (there is a definition in which when dielectric breakdown occurs at the wave front, its instantaneous value is the voltage at which discharge occurs, and when dielectric breakdown occurs at the wave tail, its peak value is the voltage at which discharge occurs).

When this voltage can be known, it becomes possible to promote the studies of discharge physics for understanding the discharge phenomenon occurring when a voltage having a steep waveform is applied as in the case of electrostatic discharge ESD, and it becomes possible to more specifically grasp the discharge occurrence status in product development and product inspection.

BRIEF DESCRIPTION OF THE DRAWINGS

FIG. 3 is a graph used for describing dielectric breakdown voltage on an impulse-shaped voltage waveform.

FIG. 4 is a flowchart showing the operation of the discharge occurrence status evaluation device shown in FIG. 1.

FIGS. 6(A), 6(B), 6(C), 6(D) and 6(E) are a set of illustrations used for describing the case where dielectric breakdowns at a plurality of locations are specified through use of two optical sensor systems.

FIGS. 10(A) and 10(B) are a set of graphs each showing the relation between light emission signal and radiation electromagnetic wave signal in synchronous measurement of optical signal and electromagnetic wave signal, where FIG. 10(B) is a graph showing, on an enlarged scale, a portion of the graph of FIG. 10(A).

MODES FOR CARRYING OUT THE INVENTION

Figure 1:
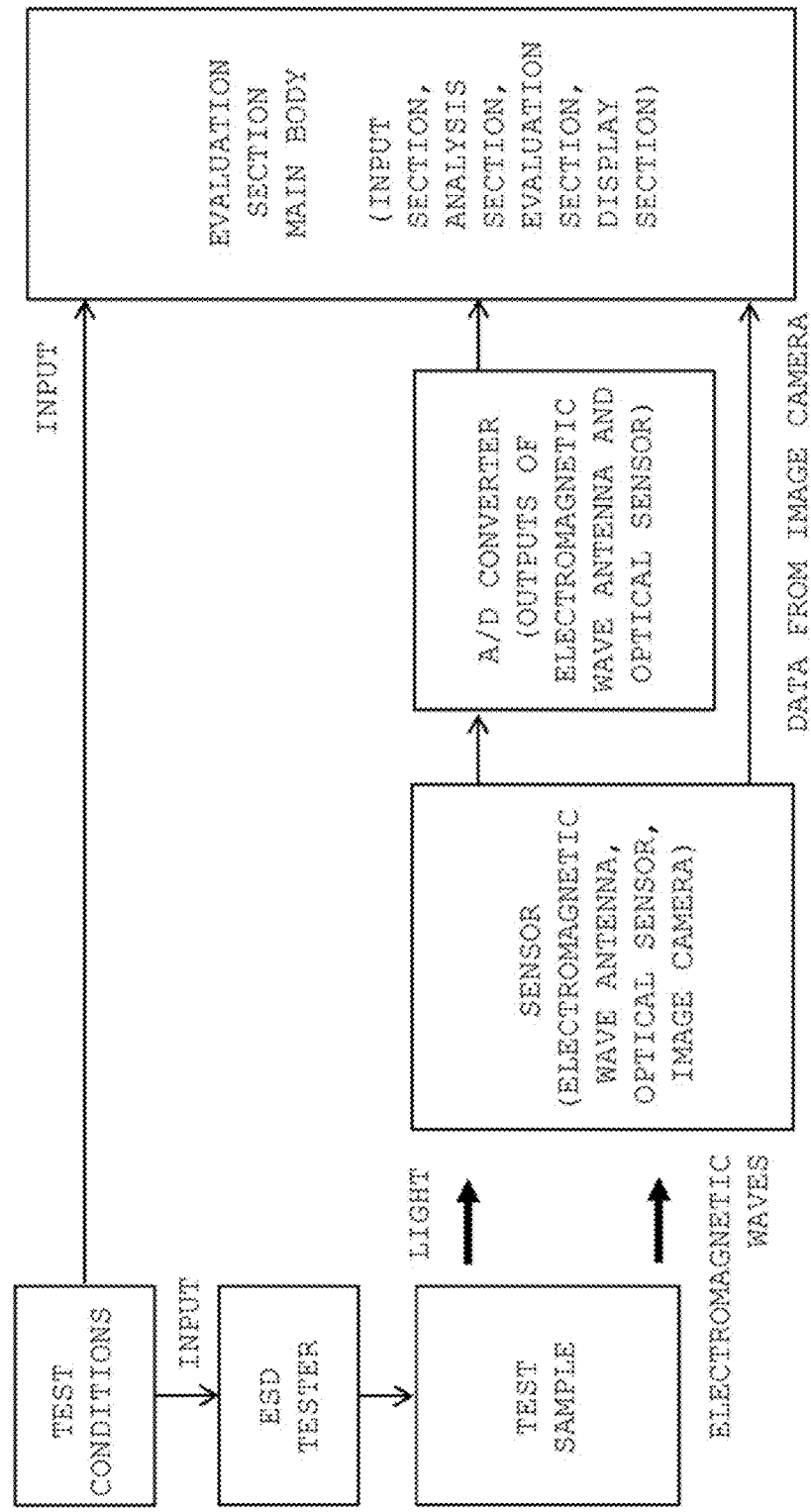
FIG. 1 is a schematic diagram of a discharge occurrence status evaluation device according to an embodiment of the present invention.

The present invention will be described by way of example. FIG. 1 is a schematic diagram of a discharge occurrence status evaluation device according to an embodiment of the present invention. A charge voltage Vc is input to an electrostatic discharge ESD tester as a test condition. Along with this charge voltage Vc, various conditions which constitute an electric circuit, such as the CR circuit conditions (resistor R and capacitor C) of the electrostatic discharge ESD tester and the circuit conditions of a to-be-tested board (the shape and length of wiring, gap condition, disposed components, etc.), are also sent to the evaluation section main body as test conditions. The electrostatic discharge ESD tester generates a voltage having an impulse-shaped waveform on the basis of the test conditions, and the evaluation section main body simulates the waveform of the impulse voltage applied to the test sample, on the basis of the test conditions and the electrical circuit conditions of the test circuit. The electrostatic discharge ESD tester itself is well known and conforms to the standard of IEC 61000-4-2. The electrostatic discharge ESD tester can apply a high impulse voltage (several tens of kilovolts) having a very steep waveform whose rising time is 1 ns or less like electrostatic discharge ESD.

The test sample is a product or a development article of electronic or electric equipment or an electronic circuit board such as a printed board used therefor. In the electrostatic discharge (ESD) test, a voltage is applied to the test sample by the electrostatic discharge ESD tester, whereby dielectric breakdown (flashover FO) occurs. An electromagnetic wave antenna which has directivity and can measure radiation electromagnetic waves with high sensitivity, an optical sensor for obtaining an optical signal, and an image camera for capturing a light emission image on the test sample are provided as sensors. A horn antenna which has sensitivity at frequencies in the GHz band and has directivity is used as the electromagnetic wave antenna. A light receiving element which amplifies the intensity of light such as a photomultiplier tube (PMT) is used as the optical sensor. However, when a photomultiplier tube PMT is disposed near a board, the photomultiplier tube PMT may fail to perform measurement due to the strong influence of electromagnetic noise from the tester. Therefore, the photomultiplier tube PMT is disposed in a dark box which has a function of electromagnetic shielding and which is separated sufficiently from the test sample, and an optical fiber which allows light having a required wave length to pass therethrough with small attenuation is disposed between the photomultiplier tube PMT and the test sample.

The electromagnetic wave antenna measures a radiation electromagnetic wave signal generated from the electrostatic discharge tester when the electrostatic discharge ESD tester is driven and a radiation electromagnetic wave signal generated from the test sample when discharge or dielectric breakdown occurs. The time difference between the time of drive of the tester and the time of occurrence of discharge or dielectric breakdown is evaluated by the evaluation section main body. In the case of a test in which a higher reliability of the evaluation of occurrence of dielectric breakdown must be secured, simultaneously with measurement of electromagnetic waves, a light emission signal is obtained by the optical sensor. Notably, in the case where measurement is performed through optical fiber, the signal from the optical sensor must be used in consideration of propagation time determined by the fiber length and the length of a cable between the sensor and the measurement main body. Similarly, the electromagnetic wave signal must be used in consideration of the length of a high-frequency coaxial cable between the electromagnetic wave antenna and the measurement main body.

Data from the image camera which captured dielectric breakdown occurred on the test sample are input to the evaluation section main body. The outputs of the electromagnetic wave antenna and the optical sensor are converted to respective digital data by respective A/D converters and the digital data are input to the evaluation section main body.

Figure 2:
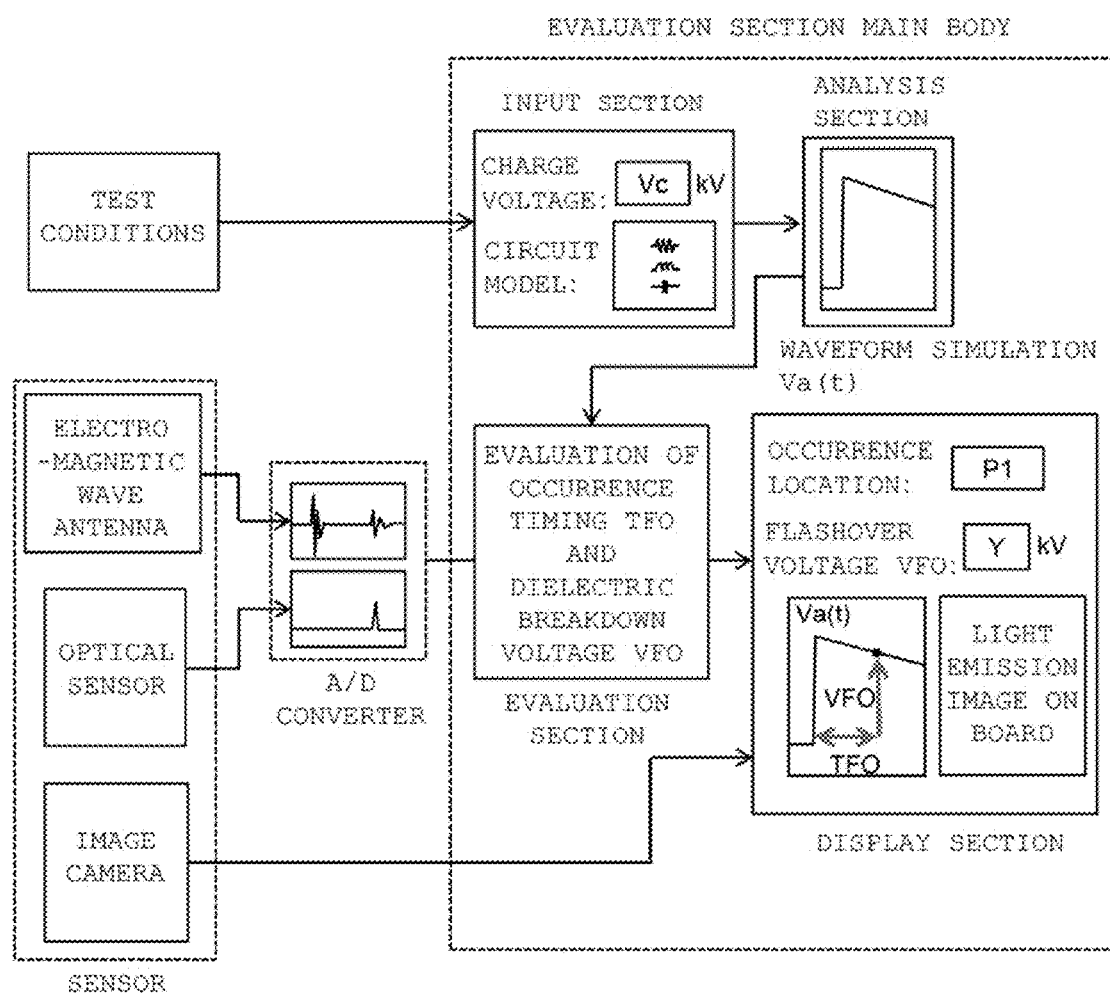
FIG. 2 is a diagram used for describing in more detail an evaluation section main body shown in FIG. 1.

FIG. 2 is a diagram used for describing in more detail the evaluation section main body shown in FIG. 1. The evaluation section main body has an input section, an analysis section, an evaluation section, and a display section. Test conditions such as a charge voltage and a circuit mold are input to the input section. The analysis section estimates an inter-gap voltage waveform Va(t) generated at a location where dielectric breakdown occurs, on the basis of the input test conditions, by simulation performed through use of the FDTD method (Finite-difference time-domain method; one method for analyzing electromagnetic fields).

The evaluation section evaluates the time difference between an applied voltage generation time and a discharge generation time, obtained from a radiation electromagnetic wave observed after the electrostatic tester has been operated, to thereby obtain an occurrence timing TFO (after the voltage application) at which dielectric breakdown (flashover) occurred on the test sample. Although evaluation through measurement of the electromagnetic wave signal is the basic, in the case where a higher reliability of the evaluation of occurrence of dielectric breakdown must be secured, the evaluation is performed by obtaining a light emission signal through use of the optical sensor simultaneously with measurement of the electromagnetic wave.

Also, in the evaluation section, dielectric breakdown voltage VFO is estimated on the basis of the time of the occurrence timing TFO. FIG. 3 is a graph used for describing dielectric breakdown voltage on an impulse-shaped voltage waveform (see Non-Patent Document 2). FIG. 3 exemplifies two generated voltage waveforms Va(t) having different peak values. VFO1 and VFO2 represent respective dielectric breakdown voltages, and TFO1 and TFO2 represent respective dielectric breakdown occurrence timings. In the case where dielectric breakdown occurred at the wave front of an impulse-shaped generated voltage waveform Va(t), its instantaneous value VFO1 is recorded as the dielectric breakdown voltage VFO. In the case where dielectric breakdown occurred at the wave tail of the generated voltage waveform Va(t), its peak value VFO2 is recorded as the dielectric breakdown voltage VFO. The determination as to whether dielectric breakdown occurred at the wave front or the wave tail is performed by determining whether the dielectric breakdown occurrence timing is before or after the time when the peak value is generated.

Also, when necessary, the evaluation section confirms the occurrence of dielectric breakdown (whether or not the electromagnetic wave antenna and the optical sensor generate their signals simultaneously), and the locations of occurrence and the number of the locations. In the case where dielectric breakdown occurred a plurality of times, for each occurrence of dielectric breakdown, the evaluation section checks the timing of occurrence, the location of occurrence, and the generated voltage at that time.

In addition to the location of occurrence of dielectric breakdown and the dielectric breakdown (flashover) voltage VFO, the display section displays an image in which the dielectric breakdown voltage VFO and the occurrence timing TFO are superimposed on a graph of the generated voltage waveform Va(t). In a situation in which waveform observation cannot be performed, the displayed image makes it easier to know the time on the electrostatic discharge ESD waveform at which discharge or dielectric breakdown occurred. Further, the display section displays a light emission image on the board captured by the image camera. In the case where dielectric breakdown occurred a plurality of time, for each occurrence of dielectric breakdown, the display section displays, in addition to the location of occurrence and the dielectric breakdown voltage VFO, an image in which the dielectric breakdown voltage VFO and the occurrence timing TFO are superimposed on a graph of the generated voltage waveform Va(t). Notably, as the location of occurrence, the display section displays the position number (address) of one of divisional regions of the surface of the board captured by the image camera, which regions are determined by the layout of an optical fiber system (for example, in the case where the surface of the board is divided into six divisional regions as shown in FIG. 6(B), position numbers P1 to P9 are assigned to the six divisional regions).

FIG. 4 is a flowchart showing the operation of the discharge occurrence status evaluation device shown in FIG. 1. In step Step1, test conditions are input to the electrostatic discharge ESD tester and the evaluation section main body. In execution of an electrostatic test of step Step2, the electrostatic test is performed by applying a voltage to a test sample by the electrostatic discharge ESD tester. In step Step3, for each application of the voltage, a determination is made as to whether to have detected a radiation electromagnetic wave signal S1 generated at the time of drive of the electrostatic discharge ESD tester and a radiation electromagnetic wave signal S2 generated at the time of occurrence of discharge or dielectric breakdown after the generation of the radiation electromagnetic wave signal S1. When necessary, simultaneously with measurement of the electromagnetic wave, a light emission signal SLight is obtained by the optical sensor. In the case where none of the radiation electromagnetic wave signal S2 and the light emission signal SLight was detected, in step Step4, it is determined that no dielectric breakdown occurred, and the result of the determination is displayed in step Step8. In the case where a signal was detected in step Step3, in step Step5, a determination is made as to whether the detected signal represents that dielectric breakdown occurred at a single location or represents that dielectric breakdown occurred at a plurality of locations. In the case where a signal representing that dielectric breakdown occurred at a single location is detected, in step Step6, the occurrence of dielectric breakdown (the dielectric breakdown occurrence timing TFO and the dielectric breakdown voltage VFO) is evaluated. In the case where a signal representing that dielectric breakdown occurred at a plurality of locations is detected, in step Step7, all the occurrences of dielectric breakdown (the dielectric breakdown occurrence timing TFO and the dielectric breakdown voltage VFO) are evaluated, and all the locations where dielectric breakdown occurred are determined.

In step Step8, the results are displayed. Namely, there are displayed the presence/absence of occurrence of dielectric breakdown, the location of occurrence, the waveform of the inter-gap generated voltage Va(t), the time of the dielectric breakdown occurrence timing TFO, the light emission image, the estimated dielectric breakdown voltage VFO. In the case where it is determined in step Step9 that the electrostatic test is to be continued, the above-described operation is repeated. In the case where the electrostatic test is not continued, the test is ended in step Step10. In general, the above-described operation is repeated by increasing the applied voltage until the applied voltage reaches a prescribed voltage.

Figure 5A:
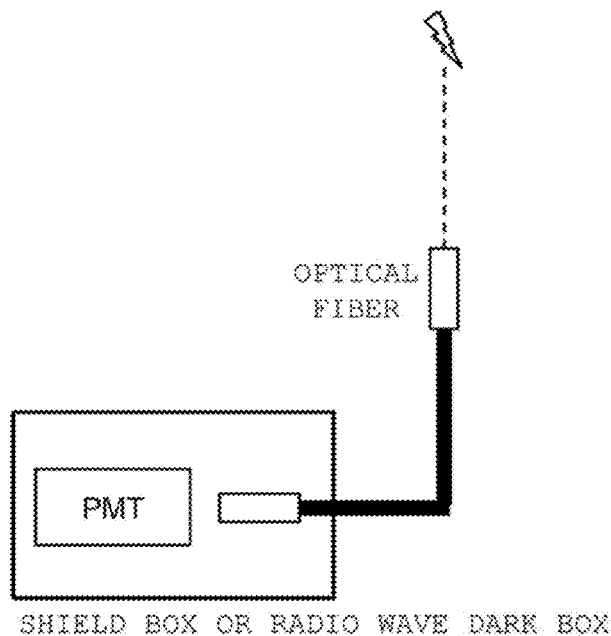
FIGS. 5(A) and 5(B) are illustrations showing the layout of an optical sensor system wherein FIG. 5(A) exemplifies the case where dielectric breakdown FO at a single location is evaluated for a specific portion, and FIG. 5(B) exemplifies the case where dielectric breakdowns at a plurality of locations are evaluated.
Figure 5B:
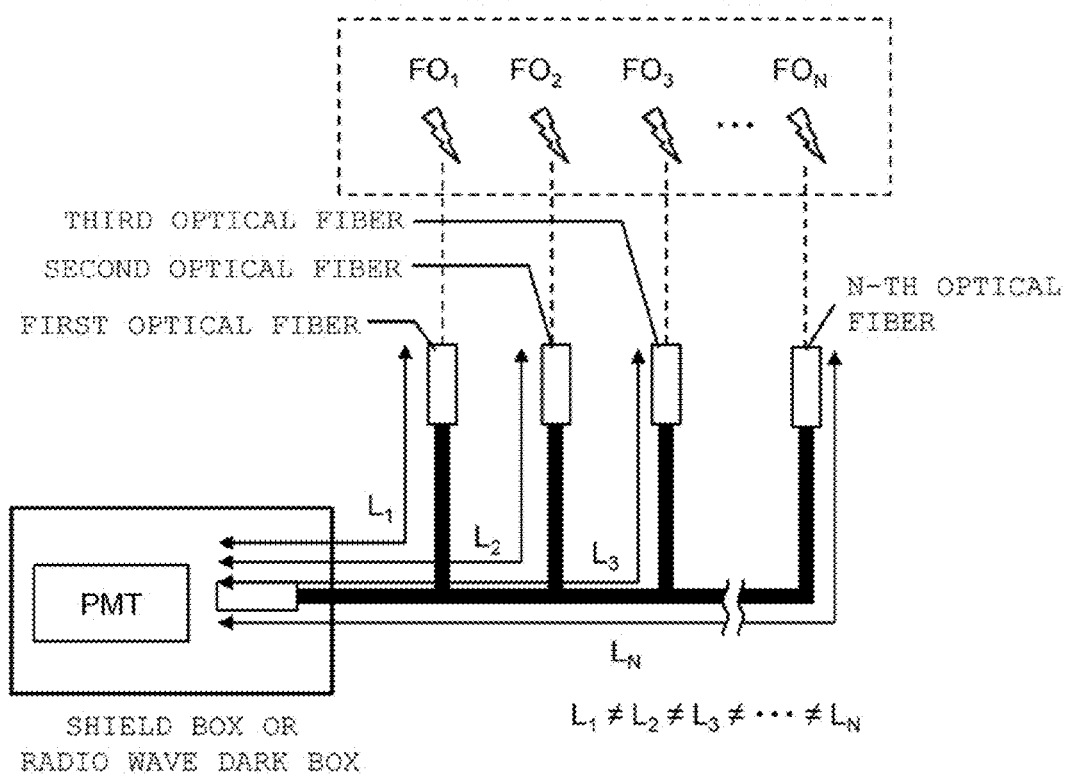

FIGS. 5(A) and 5(B) are illustrations showing the layout of the optical sensor system wherein FIG. 5(A) exemplifies the case where dielectric breakdown FO at a single location is evaluated for a specific portion, and FIG. 5(B) exemplifies the case where dielectric breakdowns at a plurality of locations (N) are evaluated. In the case where dielectric breakdown FO at a particular gap on an electronic circuit board (test sample) or dielectric breakdown FO in a particular portion is to be evaluated as shown in FIG. 5(A), a single optical sensor system is used. The occurrence of dielectric breakdown can be evaluated more reliably by detecting an optical signal in addition to the electromagnetic wave signal. Since the influence of electromagnetic noise is large in the vicinity of the electrostatic discharge ESD test apparatus, the optical sensor (a photomultiplier tube PMT) cannot be disposed directly at a position above the test sample (electronic circuit board). Therefore, the position of the optical sensor is separated from the test sample by using an optical fiber. It is desired to dispose the optical sensor in a dark box having a function of electromagnetic field.

In the case where dielectric breakdowns FO1, FO2, FO3, . . . FON occur at a plurality of locations as shown in FIG. 5(B), at least a plurality of optical fibers are prepared. The optical sensor system is mainly composed of an optical sensor (a photomultiplier tube PMT, a photodiode, or the like) for measuring the intensity waveform of emitted light and optical fibers which allow the optical sensor to be disposed at a location away from a to-be-tested board (from the viewpoint of coping with electromagnetic noise from the electrostatic discharge ESD test apparatus). Basically, it is desired that one optical sensor be provided for one optical fiber (one optical sensor receives a signal from one optical fiber). However, in order to determine a plurality of dielectric breakdown occurrence locations and the occurrence timings thereof, a plurality of optical fibers which differ at least in length are necessary. By rendering the lengths of the plurality of optical fibers different from one another, it becomes possible to determine the occurrence locations and the occurrence timings by using a single optical sensor (a photomultiplier tube PMT, a photodiode, or the like).

FIGS. 6(A), 6(B), 6(C), 6(D) and 6(E) are a set of illustrations used for describing the case where dielectric breakdowns at a plurality of locations are specified or determined through use of two optical sensor systems. Since the number of A/D converters (for example, the number of input channels of an oscilloscope) increases with the number of optical sensor systems to be used, it is effective to use two optical sensor systems. However, it is desired that the number of the optical sensor systems be 4 or less. Instead of using a plurality of optical sensor systems, an equivalent one is formed by attaching a plurality of optical fibers having different lengths to a single optical sensor such that a large number of input light emission signals are introduced to the single optical sensor. It is possible to identify an optical fiber from which a signal is output, on the basis of the known length of each optical fiber and the electromagnetic wave signal measured separately as dielectric breakdown occurrence timing. Accordingly, by disposing at least two optical sensor systems each composed of a plurality of optical fibers having different lengths and a single optical sensor along different directions (for example, the x-axis and y-axis directions) and using an electromagnetic wave antenna, it becomes possible to determine the plurality of locations where dielectric breakdown occurred and the occurrence timings thereof.

As shown in FIG. 6(A), at least two optical sensor systems are prepared. For example, in the case where the number of the optical sensor systems is two, the optical sensor systems are disposed along the x-axis and y-axis in an orthogonal relation, and determination or evaluation is made in the orthogonal coordinate system. Thus, the occurrence location (region) of dielectric breakdown can be determined along with the occurrence timing. FIG. 6(A) shows the case where two optical sensor systems are disposed along the x-axis and y-axis in an orthogonal relation and the number of the optical fibers of each optical sensor system is three. FIG. 6(B) shows the example of addresses (position numbers) of divisional regions of the measurement target. Thus, an article to be measurement (electronic circuit board) can be divided into 9 regions (3×3). Since the detection ends x1, x2, x3, y1, y2, and y3 of the optical fibers face the regions of the measurement target, it is possible to specify or determine the location (one of the position numbers P1 to P9 of the divisional regions) and the timing at which dielectric breakdown occurred.

Here is assumed that two dielectric breakdowns FO1 and FO2 occurred at locations exampled in FIG. 6(A) and in a time relation shown in FIG. 6(C). FIG. 6(D) shows an electromagnetic wave signal EMW. As shown in FIG. 6(D), a signal S2_1 corresponding to the dielectric breakdown FO1 is detected with a time delay TF01 after a signal S1 is generated as a result of drive of the ESD gun, and a signal S2_2 corresponding to the dielectric breakdown FO2 is detected with a time delay TF02. The two electromagnetic wave signals S2_1 and S2_2 following the signal S1 show that two dielectric breakdowns occurred. A determination as to whether or not the two dielectric breakdowns FO1 and FO2 occurred at the same location is made from the image data of a light emission image and the time difference of the optical sensor signal. The case where the two dielectric breakdowns FO1 and FO2 occurred at different locations will be described with reference to FIG. 6(E). The case where the two dielectric breakdowns FO1 and FO2 occurred at the same location will be described with reference to FIG. 7(D).

As shown in FIG. 6(A), each of the two optical sensors PMT1 and PMT2 uses three optical fibers having different lengths. The light receiving ends of the optical fibers for the optical sensor PMT1 are disposed at positions x1, x2, and x3, and the light receiving ends of the optical fibers for the optical sensor PMT2 are disposed at positions y1, y2, and y3. Therefore, it is possible to determine the divisional region where dielectric breakdown occurred on the basis of the magnitude of the time difference Δt between the electromagnetic wave signal and the optical signal. As shown in FIG. 6(E), the light receiving end by which the dielectric breakdown was detected can be determined on the basis of the magnitudes of Δtx of the x-axis or Δty of the y-axis.

Notably, in the case where dielectric breakdown occurs at a plurality of locations, it becomes difficult to accurately predict the voltage generated as a result of the second dielectric breakdown or dielectric breakdown subsequent thereto. The voltage drop increases as a result of breakdown, which makes it difficult to predict the voltage waveform after the breakdown. Therefore, for the second dielectric breakdown or dielectric breakdown subsequent thereto, the occurrence timing and the occurrence location are mainly evaluated. Since the voltage generated as a result of the first dielectric breakdown is important, it is important to evaluate the voltage generated as a result of the first dielectric breakdown. The validity of the result can be confirmed by comparing the result with the data of an image of the board captured from a position above the board.

Figure 7A:
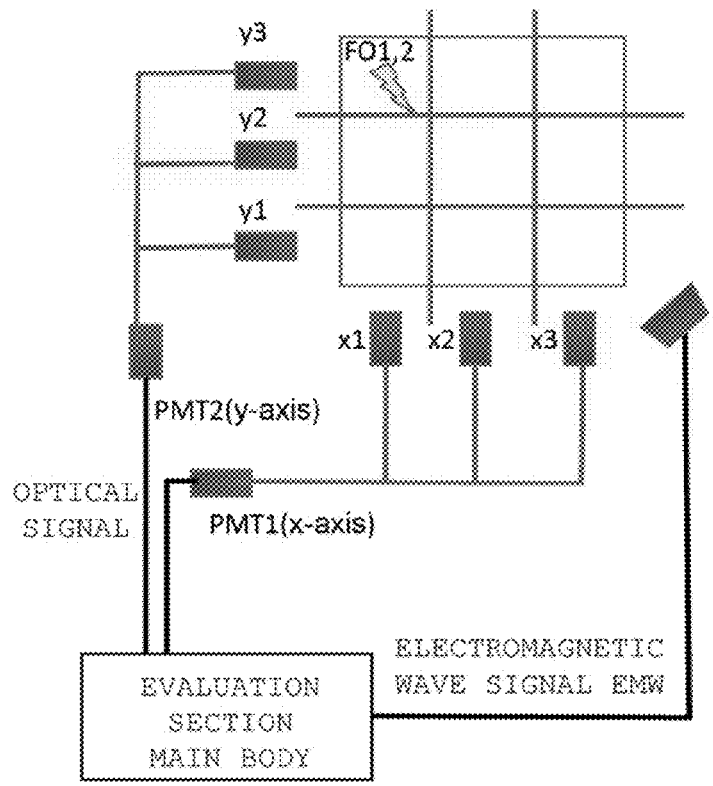
FIGS. 7(A), 7(B), 7(C) and 7(D) are a set of illustrations used for describing the case where two dielectric breakdowns occurred at the same location are specified.
Figure 7B:
Figure 7C:
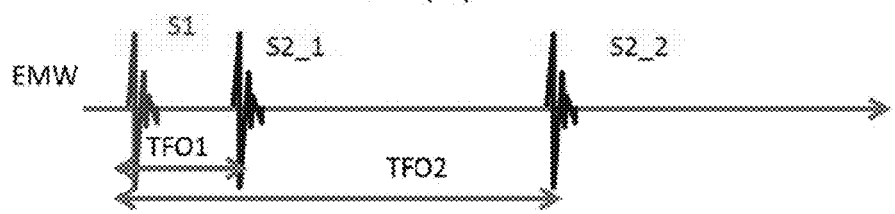
Figure 7D:
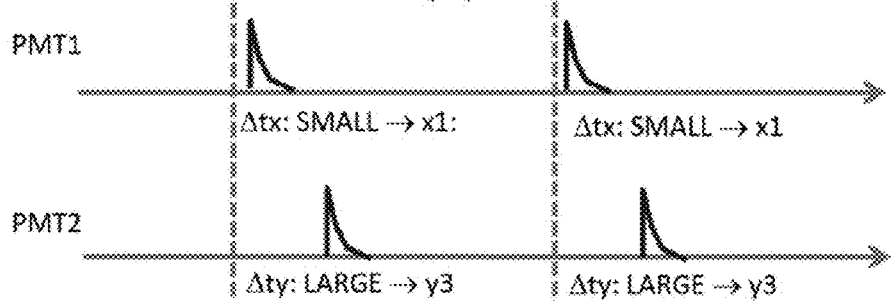

FIGS. 7(A), 7(B), 7(C) and 7(D) are a set of illustrations used for describing the case where two dielectric breakdowns occurred at the same location are specified. Two optical sensor systems are disposed in the same layout as that shown in FIG. 6(A). The electromagnetic wave signal EMW shown in FIG. 7(C) shows that two dielectric breakdowns occurred as in the case of FIG. 6(D). Meanwhile, FIG. 7(D) shows that the dielectric breakdowns FO1 and FO2 occurred at the same location, because they are the same in terms of the magnitudes of the time differences Δtx and Δty between the electromagnetic wave signal and the optical signal.

(Measurement of Dielectric Breakdown Phenomenon)

A printed circuit board was used as a test sample, and there was measured a dielectric breakdown phenomenon which occurred across the gap between patterns on a printed wiring board as a result of application of an electrostatic discharge (ESD) surge voltage to the printed wiring board by an ESD gun.

Figure 8:
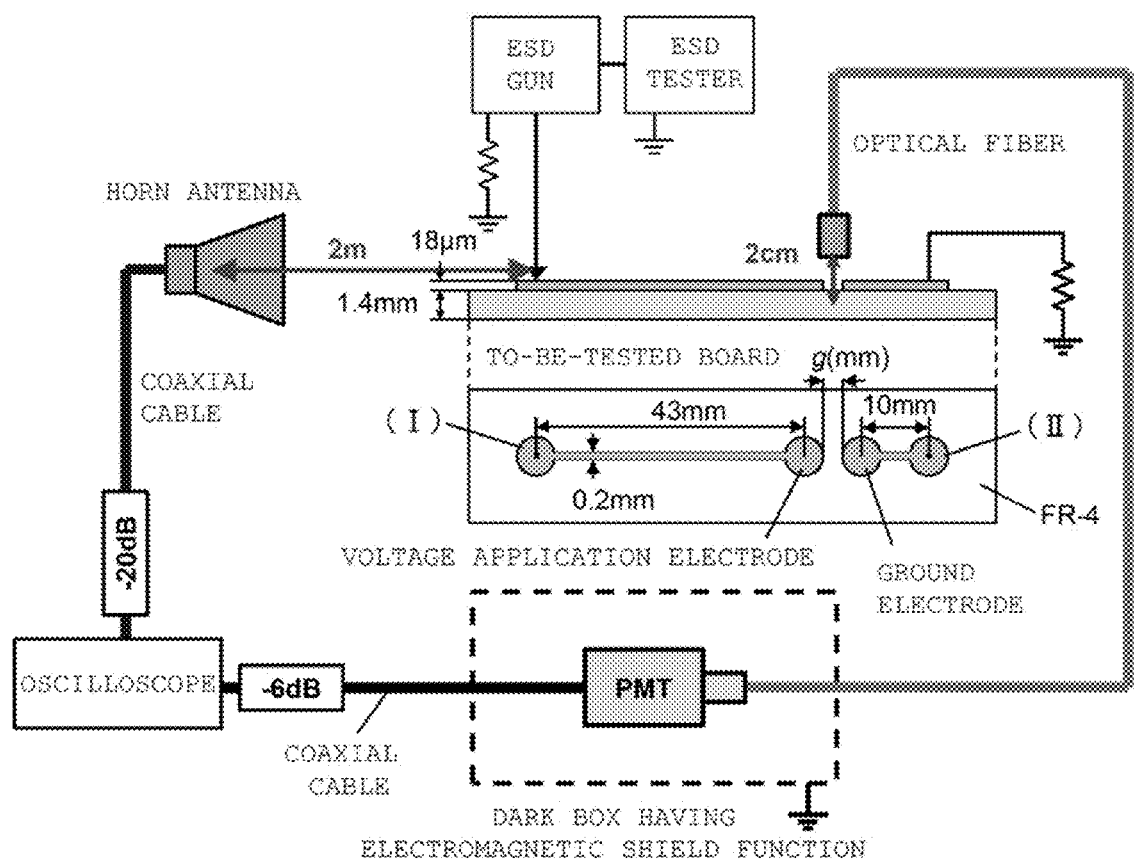
FIG. 8 is a diagram showing a circuit configuration used in an experiment.

FIG. 8 is a diagram showing a circuit configuration used in an experiment. As shown in FIG. 8, to-be-tested boards used in the experiment have circular electrodes located adjacent to each other with a gap formed therebetween and have different gap lengths g within a range of 0.1 to 2.0 mm within which gaseous discharge occurs predominantly. The voltage application electrode and the ground electrode are formed by patterning copper foil (thickness: 18 μm) on a printed wiring board (FR-4) having a thickness of 1.6 mm. A pointed end of a contact discharge tip (discharge electrode) of an ESD gun (NoiseKen/TC1815R) connected to an ESD tester is brought into contact with the left end of the electrode indicted by (I) in FIG. 8. An earth pin is attached to the right end of the electrode indicated by (II) and is connected to a horizontal connection plate on a test bench. A horn antenna is disposed at a position spaced 2 m from the tip end of the ESD gun such that the horn antenna faces toward the ESD gun. The horn antenna is connected to a digital oscilloscope (Tektronix/DPO4104; 1 GHz) through an attenuator of 20 dB. A photomultiplier tube PMT (Hamamatsu Photonics/H6780) is connected to this oscilloscope through a coaxial cable. The light receiving end of the optical fiber connected to the photomultiplier tube PMT is fixed at a position which is located at the center of the gap between the electrodes and whose height is 2 cm as measured from the surface of the printed wiring board. The photomultiplier tube PMT is disposed in an electromagnetic shield box which satisfies the dark box specifications, so as to prevent electromagnetic waves radiated from the ESD gun or radiated as a result of discharge from affecting the output of the photomultiplier tube PMT.

Figure 9:
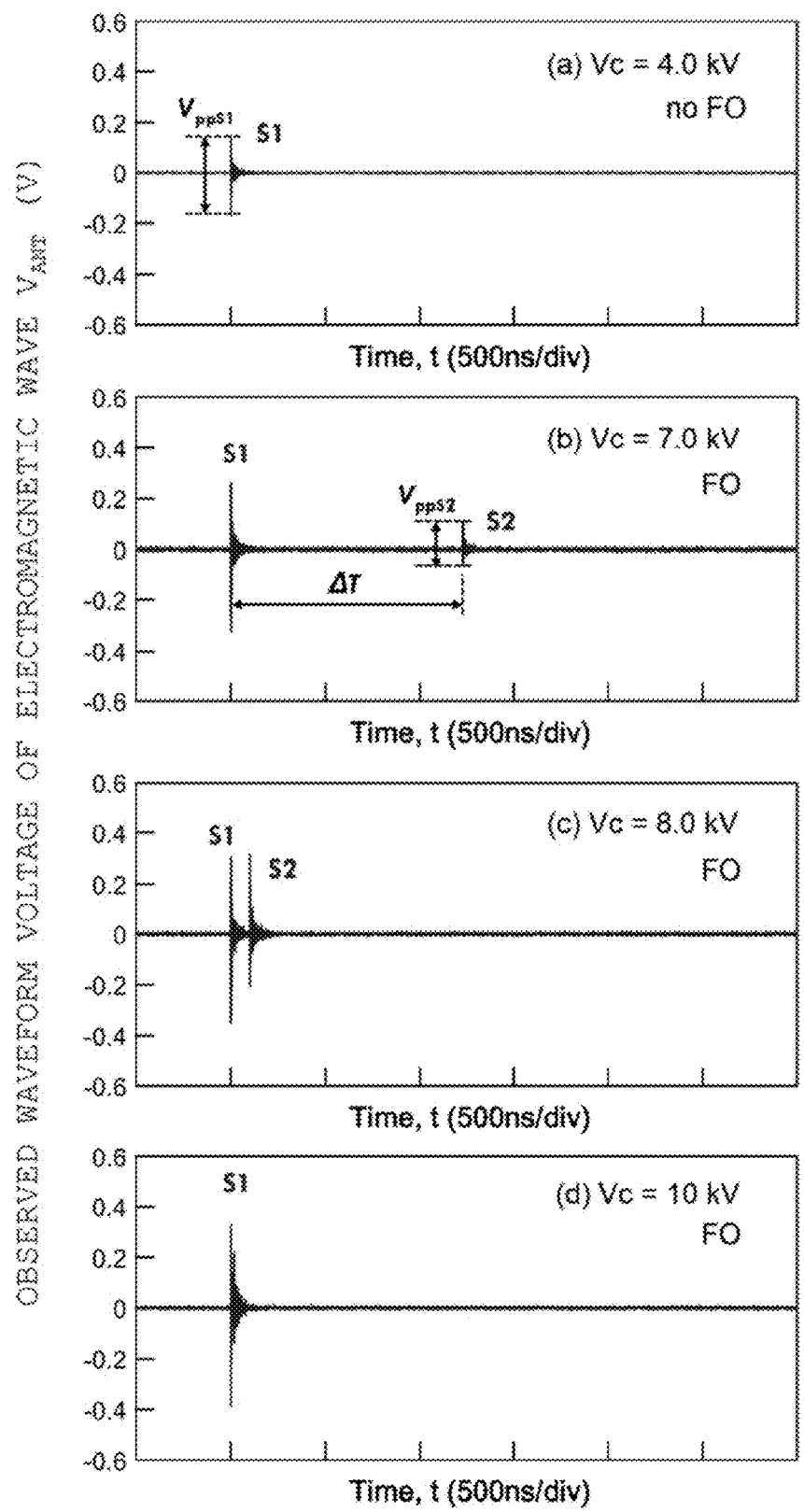
FIG. 9 is a set of graphs showing the observed waveform voltages VANT of electromagnetic waves obtained by performing a dielectric breakdown FO test while changing charge voltage Vc.

In the experiment, the ESD gun was charged to a charge voltage Vc, whereby discharge was produced. A radiation electromagnetic wave generated at that time was observed by the oscilloscope. Section (a) through (d) of FIG. 9 show observed waveform voltages VANT of electromagnetic waves for the case where a to-be-tested board having a gap length of 1.0 mm was used, and a test for detecting dielectric breakdown FO was performed while the charge voltage Vc was changed. As shown in section (a) of FIG. 9, in the case where dielectric breakdown FO did not occurred, one signal was observed (S1). Namely, an electromagnetic wave signal obtained when no dielectric breakdown occurred contains only the signal S1 generated when the electrostatic discharge ESD test apparatus was driven.

When the charge voltage Vc was increased and dielectric breakdown FO occurred, as shown in sections (b) and (c) of FIG. 9, two signals (S1, S2) were observed. S1 is a radiation electromagnetic wave from the test apparatus at the time when the ESD gun wad driven, and S2 is an electromagnetic wave stemming from the dielectric breakdown FO. Namely, in the case where dielectric breakdown occurred, the electromagnetic wave signal contains two signals; i.e., the signal S1 generated when the electrostatic discharge ESD test apparatus was driven, and the signal S2 generated when the dielectric breakdown occurred. The time difference ΔT between the two signals decreases as the charge voltage Vc increases. When the charge voltage Vc became equal to higher than 10 kV, as shown in section (d) of FIG. 9, the signal S2 was not observed because the signal S2 was superimposed on the wave tail of the signal S1. However, the two signals can be observed when the time range is expanded. Both the maximum amplitudes VppS1 and VppS2 of the two signals S1 and S2 increase with the charge voltage Vc.

FIGS. 10(A) and 10(B) are graphs each showing the relation between the light emission signal and the radiation electromagnetic wave signal in synchronous measurement of the optical signal and the electromagnetic wave signal, where (B) is a graph showing, on an enlarged scale, a portion of the graph of (A). In these graphs, the results of a test in which a to-be-tested board having a gap length of 1.0 mm was used and the charge voltage Vc was set to 7.0 kV are shown as an example. Specifically, a signal VPMT obtained by measuring light emission by the oscilloscope is shown on the upper side of each graph, and the observed voltage wave form of a radiation electromagnetic wave signal VANT is shown on the lower side of each graph. As shown in these graphs, a radiation electromagnetic wave signal S2 was observed at approximately the same time as a light emission signal SLight. However, the signal S2 was observed slightly earlier than the signal SLight by ΔTL, and the value of ΔTL was 12.5 ns. This time difference is caused by a transmission time difference between the radiation electromagnetic wave signal and the light emission signal before reaching the oscilloscope, which transmission time difference changes depending on the layout of the antenna and the optical sensor and the lengths of the cable and the optical fibers. Therefore, the radiation electromagnetic wave signal S2 and the light emission signal SLight are generated at the same time, and it is possible to confirm that the signal S2 is a signal generated as a result of dielectric breakdown.

Figure 11:
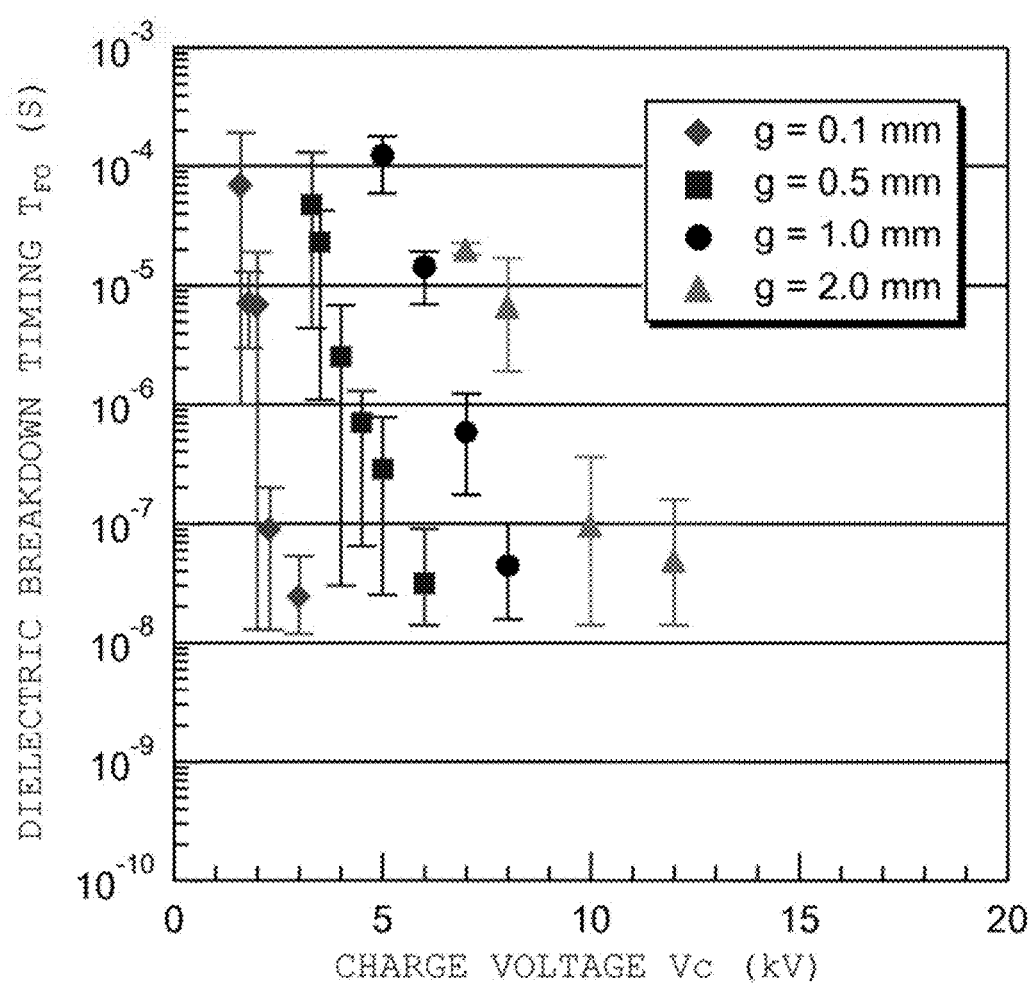
FIG. 11 is a graph showing the results of measurement of the charge voltage Vc dependency of dielectric breakdown timing TFO at which dielectric breakdown occurs between circular electrodes (gap length g) of printed board wiring.

FIG. 11 is a graph showing the results of measurement of the charge voltage Vc dependency of the dielectric breakdown timing TFO at which dielectric breakdown occurs between circular electrodes (gap length g) of printed board wiring. As shown in FIG. 11, within the range of the charge voltage Vc for which the experiment was performed, the dielectric breakdown timing TFO was several tens of nanoseconds to several hundreds of microseconds. Irrespective of the gap length g of the to-be-tested board, at a charge voltage Vc near the lowest voltage at which the dielectric breakdown voltage VFO can be generated, the dielectric breakdown timing TFO was several tens of microseconds to several hundreds of microseconds. When the charge voltage Vc increased, the dielectric breakdown timing TFO decreased and became 200 ns or less in some cases.

When the gap length increases, the dielectric breakdown voltage increases. However, when attention is paid to one gap length, the graph shows that higher the applied voltage, the shorter the time TFO before occurrence of dielectric breakdown.

Although only some exemplary embodiments of this invention have been described in detail above, those skilled in the art will readily appreciated that many modifications are possible in the exemplary embodiments without materially departing from the novel teachings and advantages of this invention.

The invention claimed is:

1. A discharge occurrence status evaluation device for evaluating the status of discharge or dielectric breakdown having occurred as a result of application of an impulse voltage or current to a test sample by an electrostatic discharge tester, comprising:
   an electromagnetic wave antenna for measuring a radiation electromagnetic wave signal generated from the electrostatic discharge tester when the electrostatic discharge tester is driven and a radiation electromagnetic wave signal generated from the test sample when discharge or dielectric breakdown occurs; and
   an evaluation section main body for obtaining a time difference between an applied voltage generation time obtained from the radiation electromagnetic wave signal generated when the electrostatic discharge tester was driven and a discharge generation time obtained from the radiation electromagnetic wave signal generated when the discharge or dielectric breakdown occurred, and displaying a dielectric breakdown occurrence timing TFO after application of the impulse voltage and a dielectric breakdown voltage VFO estimated on the basis of the timing, the dielectric breakdown occurrence timing TFO being obtained from the time difference between the applied voltage generation time detected from the radiation electromagnetic wave signal measured by the electromagnetic wave antenna and the discharge generation time detected from the radiation electromagnetic wave signal measured by the electromagnetic wave antenna.

2. A discharge occurrence status evaluation device according to claim 1, further comprising an optical sensor for obtaining a light emission signal generated when the discharge or dielectric breakdown occurred.

3. A discharge occurrence status evaluation device according to claim 2, further comprising at least two optical sensor systems each of which is composed of the optical sensor and a plurality of optical fibers attached to the optical sensor and having different lengths and which are disposed along different directions, wherein a plurality of locations where discharge or dielectric breakdown occurred and timings at which discharge or dielectric breakdown occurred are determined on the basis of a layout of each optical sensor system in which light receiving ends of the optical fibers face divisional regions of a measurement target, differences in length among the plurality of optical fibers, and the radiation electromagnetic wave signal.

4. A discharge occurrence status evaluation device according to claim 1, wherein test conditions input to the electrostatic discharge tester and electrical circuit conditions of a test circuit are sent to the evaluation section main body, and simulation for estimating the waveform of the impulse voltage applied to the test sample is performed, and wherein, when dielectric breakdown occurs at a wave front of the waveform of the impulse voltage before its peak, an instantons value of the impulse voltage is obtained as the dielectric breakdown voltage VFO, and when dielectric breakdown occurs at a wave tail of the waveform of the impulse voltage after its peak, a peak value of the impulse voltage is obtained as the dielectric breakdown voltage VFO.

5. A discharge occurrence status evaluation device according to claim 4, wherein the evaluation section main body displays the dielectric breakdown occurrence timing TFO and the dielectric breakdown voltage VFO by superimposing them on the waveform of the impulse voltage.

6. A discharge occurrence status evaluation device according to claim 1, further comprising an image camera for capturing a light emission image on the test sample, wherein the evaluation section main body displays the obtained light emission image.

7. A discharge occurrence status evaluation method for evaluating the status of discharge or dielectric breakdown having occurred as a result of application of an impulse voltage to a test sample by an electrostatic discharge tester, comprising:
   inputting test conditions to the electrostatic discharge tester;
   causing the electrostatic discharge tester to apply an impulse voltage for generating dielectric breakdown to the test sample on the basis of the test conditions;
   obtaining a radiation electromagnetic wave signal generated when the electrostatic discharge tester is driven and a radiation electromagnetic wave signal generated when discharge or dielectric breakdown occurs; and
   obtaining a time difference between an applied voltage generation time obtained from the radiation electromagnetic wave signal generated when the electrostatic discharge tester was driven and a discharge generation time obtained from the radiation electromagnetic wave signal generated when the discharge or dielectric breakdown occurred, and displaying a dielectric breakdown occurrence timing TFO after application of the impulse voltage and a dielectric breakdown voltage VFO, the dielectric breakdown occurrence timing TFO being obtained from the time difference between the applied voltage generation time detected from the radiation electromagnetic wave signal measured by the electromagnetic wave antenna and the a discharge generation time detected from the radiation electromagnetic wave signal measured by the electromagnetic wave antenna.

8. A discharge occurrence status evaluation method according to claim 7, further comprising obtaining, through use of an optical sensor, a light emission signal generated when the discharge or dielectric breakdown occurred, simultaneously with obtainment of the radiation electromagnetic wave signal.

9. A discharge occurrence status evaluation method according to claim 8, further comprising:
   disposing, along at least two different directions, at least two optical sensor systems each of which is composed of the optical sensor and a plurality of optical fibers attached to the optical sensor and having different lengths; and determining a plurality of locations where discharge or dielectric breakdown occurred and timings at which discharge or dielectric breakdown occurred on the basis of a layout of each optical sensor system in which light emission signal detecting ends of the optical fibers face divisional regions of a measurement target, differences in length among the plurality of optical fibers, and the radiation electromagnetic wave signal.

\* \* \* \* \*